(12) United States Patent
Oh et al.

(10) Patent No.: US 8,345,474 B2
(45) Date of Patent: Jan. 1, 2013

(54) MAGNETIC MEMORY DEVICES INCLUDING MAGNETIC LAYERS HAVING DIFFERENT PRODUCTS OF SATURATED MAGNETIZATION AND THICKNESS AND RELATED METHODS

(75) Inventors: Sechung Oh, Suwon-si (KR); Kyung Jin Lee, Seoul (KR); Jangeun Lee, Suwon-si (KR); Hong Ju Suh, Seoul (KR)

(73) Assignees: Samsung Electronics Co., Ltd. (KR); Korea University Research and Business Foundation (KR)

( * ) Notice: Subject to any disclaimer, the term of this patent is extended or adjusted under 35 U.S.C. 154(b) by 290 days.

(21) Appl. No.: 12/769,287

(22) Filed: Apr. 28, 2010

(65) Prior Publication Data

US 2010/0277976 A1    Nov. 4, 2010

(30) Foreign Application Priority Data

Apr. 29, 2009   (KR) .................. 10-2009-0037593

(51) Int. Cl.
*G11C 11/14*   (2006.01)

(52) U.S. Cl. ........ 365/171; 365/148; 365/158; 977/933; 977/935

(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935

See application file for complete search history.

(56) References Cited

U.S. PATENT DOCUMENTS 5,695,864 A    12/1997   Slonczewski
(Continued)

FOREIGN PATENT DOCUMENTS

JP    2006-172686    6/2006
(Continued)

OTHER PUBLICATIONS

Baibich et al. "Giant Magnetoresistance of (001)Fe/(001)Cr Magnetic Superlattices" *Physical Review Letters* 61(21):2472-2475 (Nov. 21, 1988).

(Continued)

*Primary Examiner* — Richard Elms
*Assistant Examiner* — Harry W Byrne
(74) *Attorney, Agent, or Firm* — Myers Bigel Sibley & Sajovec, P.A.

(57) ABSTRACT

A magnetic memory device may include a tunnel barrier, a reference layer on a first side of the tunnel barrier, and a free layer on a second side of the tunnel barrier so that the tunnel barrier is between the reference and free layers. The free layer may include a first magnetic layer adjacent the tunnel barrier, a nonmagnetic layer on the first magnetic layer, and a second magnetic layer on the nonmagnetic layer. More particularly, the nonmagnetic layer may be between the first and second magnetic layers, and the first magnetic layer may be between the tunnel barrier and the second magnetic layer. A product of a saturated magnetization of the first magnetic layer and a thickness of the first magnetic layer may be less than a product of a saturated magnetization of the second magnetic layer and a thickness of the second magnetic layer. Related methods are also discussed.

20 Claims, 3 Drawing Sheets

U.S. PATENT DOCUMENTS

| | | | |
|---|---|---|---|
| 6,303,218 B1 * | 10/2001 | Kamiguchi et al. | 428/332 |
| 6,495,275 B2 * | 12/2002 | Kamiguchi et al. | 360/324.11 |
| 7,092,283 B2 | 8/2006 | Jeong et al. | |
| 7,164,598 B2 | 1/2007 | Jeong et al. | |
| 7,369,428 B2 | 5/2008 | Jeong | |
| 7,372,722 B2 | 5/2008 | Jeong et al. | |
| 7,523,543 B2 | 4/2009 | Byun et al. | |
| 7,589,994 B2 | 9/2009 | Jeong et al. | |
| 2002/0009616 A1 * | 1/2002 | Kamiguchi et al. | 428/692 |
| 2006/0027846 A1 | 2/2006 | Lee et al. | |
| 2006/0110629 A1 | 5/2006 | Sato | |
| 2007/0188924 A1 | 8/2007 | Tamai et al. | |
| 2007/0206411 A1 | 9/2007 | Lee et al. | |
| 2007/0253118 A1 | 11/2007 | Hayakawa et al. | |
| 2008/0180980 A1 | 7/2008 | Huang | |

FOREIGN PATENT DOCUMENTS

| | | |
|---|---|---|
| JP | 2007-184066 | 7/2007 |
| JP | 2007-294737 | 11/2007 |
| KR | 1020060056860 | 5/2006 |

OTHER PUBLICATIONS

Binasch et al. "Enhanced magnetoresistance in layered magnetic structures with antiferromagnetic interlayer exchange" *The American Physical Society* 39(7):4828-4830 (Mar. 1, 1989).

Berger "Emission of spin waves by a magnetic multilayer traversed by a current" *The American Physical Society* 54(13):9353-9358 (Oct. 1, 1996).

Ikeda et al. "Magnetic Tunnel Junctions for Spintronic Memories and Beyond" *IEEE Transactions on Electron Devices* 54(3):991-1002 (May 2007).

Myers et al. "Current-Induced Switching of Domains in Magnetic Multilayer Devices" *Science* 285:867-870 (Aug. 6, 1999).

Slonczewski "Current-driven excitation of magnetic multilayers" Journal of Magnetism and Magnetic Materials 159:L1-L7 (1996).

* cited by examiner

MAGNETIC MEMORY DEVICES INCLUDING MAGNETIC LAYERS HAVING DIFFERENT PRODUCTS OF SATURATED MAGNETIZATION AND THICKNESS AND RELATED METHODS

RELATED APPLICATION

This U.S. non-provisional patent application claims priority under 35 U.S.C. §119 of Korean Patent Application No. 10-2009-0037593, filed on Apr. 29, 2009, the entire disclosure of which is hereby incorporated herein by reference.

BACKGROUND

The present disclosure relates to electronics, and more particularly, to electronic memory devices and related methods.

As electronic devices provide increased speed and reduced power consumption, memory devices incorporated in the electronic devices may also be required to provide increased speed for read/write operations and/or reduced operation voltages. Magnetic memory devices are being studied as devices that may satisfy these requirements. Magnetic memory devices capable of providing high speed and/or non-volatile operations are thus being considered for next generation memory applications.

Generally, a magnetic memory device may include a magnetic tunnel junction (MTJ) pattern. The magnetic tunnel junction (MTJ) pattern may be formed using two magnetic substances and an insulating layer provided between the two magnetic substances, and a resistance of the magnetic tunnel junction (MTJ) pattern may be changed by changing magnetization directions of the two magnetic substances. For example, when magnetization directions of the two magnetic substances are non-parallel or anti-parallel with respect to each other, the magnetic tunnel junction (MTJ) pattern may have a relatively high resistance, and when magnetization directions of the two magnetic substances are parallel with respect to each other, the magnetic tunnel junction (MTJ) pattern may have a relatively low resistance. Data may thus be written by changing a magnetization direction of one of the two magnetic substances, and data may be read by detecting differences of the resistance of the magnetic tunnel junction (MTJ) pattern.

SUMMARY

According to some embodiments of the inventive concept, a magnetic memory device may include a substrate, a reference layer and a free layer on the substrate, and a tunnel barrier between the reference layer and the free layer. The free layer may include a first magnetic layer adjacent the reference layer, a second magnetic layer spaced apart from the first magnetic layer and a nonmagnetic layer between the first and second magnetic layers. A product of a saturated magnetization of the first magnetic layer and a thickness of the first magnetic layer may be less than half of a product of a saturated magnetization of the second magnetic layer and a thickness of the second magnetic layer.

According to some other embodiments of the inventive concept, a magnetic memory device may include a tunnel barrier, a reference layer on a first side of the tunnel barrier, and a free layer on a second side of the tunnel barrier so that the tunnel barrier is between the reference and free layers. The free layer may include a first magnetic layer adjacent the tunnel barrier, a nonmagnetic layer on the first magnetic layer, and a second magnetic layer on the nonmagnetic layer. The nonmagnetic layer may be between the first and second magnetic layers, and the first magnetic layer may be between the tunnel barrier and the second magnetic layer. A product of a saturated magnetization of the first magnetic layer and a thickness of the first magnetic layer may be less than a product of a saturated magnetization of the second magnetic layer and a thickness of the second magnetic layer.

The product of the saturated magnetization of the first magnetic layer and the thickness of the first magnetic layer may be less than half the product of the saturated magnetization of the second magnetic layer and the thickness of the second magnetic layer. The product of the saturated magnetization of the first magnetic layer and the thickness of the first magnetic layer may be greater than one-sixth the product of the saturated magnetization of the second magnetic layer and the thickness of the second magnetic layer.

The saturated magnetization of the first magnetic layer may be less than the saturated magnetization of the second magnetic layer. The first magnetic layer may be a ferromagnetic material doped with a light metal, for example, having an atomic weight no greater than that of titanium. Stated in other words, the first magnetic layer may be a layer of a ferromagnetic material having a concentration of the light metal that is greater than a concentration of the light metal in the second magnetic layer. In some embodiments, the first magnetic layer may be a ferromagnetic material doped with aluminum. Moreover, a thickness of the first magnetic layer may be less than a thickness of the second magnetic layer.

The reference layer may include a first reference magnetic layer, a second reference magnetic layer adjacent the tunnel barrier, and the reference nonmagnetic layer interposed between the first and second reference magnetic layers. In addition, a pinning layer may be provided adjacent the first reference magnetic layer so that the first reference magnetic layer is between the reference nonmagnetic layer and the pinning layer.

A first electrode may be provided adjacent the reference layer, a second electrode may be provided adjacent to the free layer, and the reference, free, and tunnel barrier layers may be between the first and second electrodes. Moreover, a substrate may be on the first electrode so that the first electrode is between the substrate and the reference layer, or the substrate may be on the second electrode so that the second electrode is between the substrate and the free layer. In addition, a controller may be configured to perform a writing operation by applying a current between the first and second electrodes in a direction perpendicular to the first and second electrodes so that the programming current passes through the reference layer, the tunnel barrier, and the free layer.

According to still other embodiments of the inventive concept, a method of storing data using a magnetic memory device structure may include providing a magnetic tunnel junction structure including a tunnel barrier, a reference layer on a first side of the tunnel barrier, and a free layer on a second side of the tunnel barrier so that the tunnel barrier is between the reference and free layers. The free layer may include a first magnetic layer adjacent the tunnel barrier, a nonmagnetic layer on the first magnetic layer, and a second magnetic layer on the nonmagnetic layer so that the nonmagnetic layer is between the first and second magnetic layers and so that the first magnetic layer is between the tunnel barrier and the second magnetic layer. Moreover, a product of a saturated magnetization of the first magnetic layer and a thickness of the first magnetic layer may be less than a product of a saturated magnetization of the second magnetic layer and a thickness of the second magnetic layer. In addition, an electrical current may be applied through the reference layer, the tunnel barrier, and the free layer to perform a write operation for the MTJ structure.

Applying the electrical current may include applying a first electrical current in a first direction from the reference layer to the free layer to program the MTJ structure to a first data value, and applying a second electrical current in a second direction from the free layer to the reference layer to program the MTJ structure to a second data value different from the first data value. The product of the saturated magnetization of the first magnetic layer and the thickness of the first magnetic layer may be less than half the product of the saturated magnetization of the second magnetic layer and the thickness of the second magnetic layer. The product of the saturated magnetization of the first magnetic layer and the thickness of the first magnetic layer may be greater than one-sixth the product of the saturated magnetization of the second magnetic layer and the thickness of the second magnetic layer.

The saturated magnetization of the first magnetic layer may be less than the saturated magnetization of the second magnetic layer, and the first magnetic layer may include a layer of a ferromagnetic material doped with a light metal, for example, having an atomic weight no greater than that of titanium. The first magnetic layer, for example, may include a layer of a ferromagnetic material doped with aluminum so that a concentration of aluminum in the first magnetic layer is greater than a concentration of aluminum in the second magnetic layer. A thickness of the first magnetic layer may be less than a thickness of the second magnetic layer.

The reference layer may include a first reference magnetic layer, a second reference magnetic layer adjacent the tunnel barrier, and the reference nonmagnetic layer interposed between the first and second reference magnetic layers. In addition, the MTJ structure may include a pinning layer adjacent the first reference magnetic layer, so that the first reference magnetic layer is between the reference nonmagnetic layer and the pinning layer.

BRIEF DESCRIPTION OF THE DRAWINGS

The accompanying drawings are included to provide a further understanding of embodiments of the inventive concept, and the accompanying drawings are incorporated in and constitute a part of this specification. The drawings illustrate examples of embodiments of the inventive concept and, together with the description, serve to explain principles thereof. In the figures.

DETAILED DESCRIPTION

Advantages and features of the inventive concept and methods of accomplishing the same may be understood more readily by reference to the following detailed description of embodiments and the accompanying drawings. The inventive concept may, however, be embodied in many different forms and should not be construed as being limited to embodiments set forth herein. Rather, these embodiments are provided so that this disclosure will be thorough and complete and will fully convey concepts of the invention to those skilled in the art, and the inventive concept will be defined by the appended claims. Like reference numerals refer to like elements throughout the specification.

It will be understood that when an element is referred to as being "on", "connected to", or "coupled to" another element, it can be directly on, directly connected to, or directly coupled to the other element or intervening elements may be present. In contrast, when an element is referred to as being "directly on", "directly connected to", or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various layers, regions, elements, components, and/or sections, these layers, regions, elements, components, and/or sections should not be limited by these terms. These terms are only used to distinguish one layer, region, element, component, or section from another layer, region, element, component, or section. Thus, a first layer, region, element, component, or section discussed below could be termed a second layer, region, element, component, or section without departing from the teachings of the inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes", and/or "including", when used in this specification, specify the presence of stated layers, regions, features, integers, steps, operations, elements, and/or components, but do not preclude the presence or addition of one or more other layers, regions, features, integers, steps, operations, elements, components, and/or groups thereof.

In the drawings, the illustrated features may be changed due to, for example, manufacturing technology and/or tolerance. Accordingly, it should be understood that the examples of embodiments discussed herein are not limited to the drawings but include modifications of features of elements caused, for example, by manufacturing processes.

Figure 1:
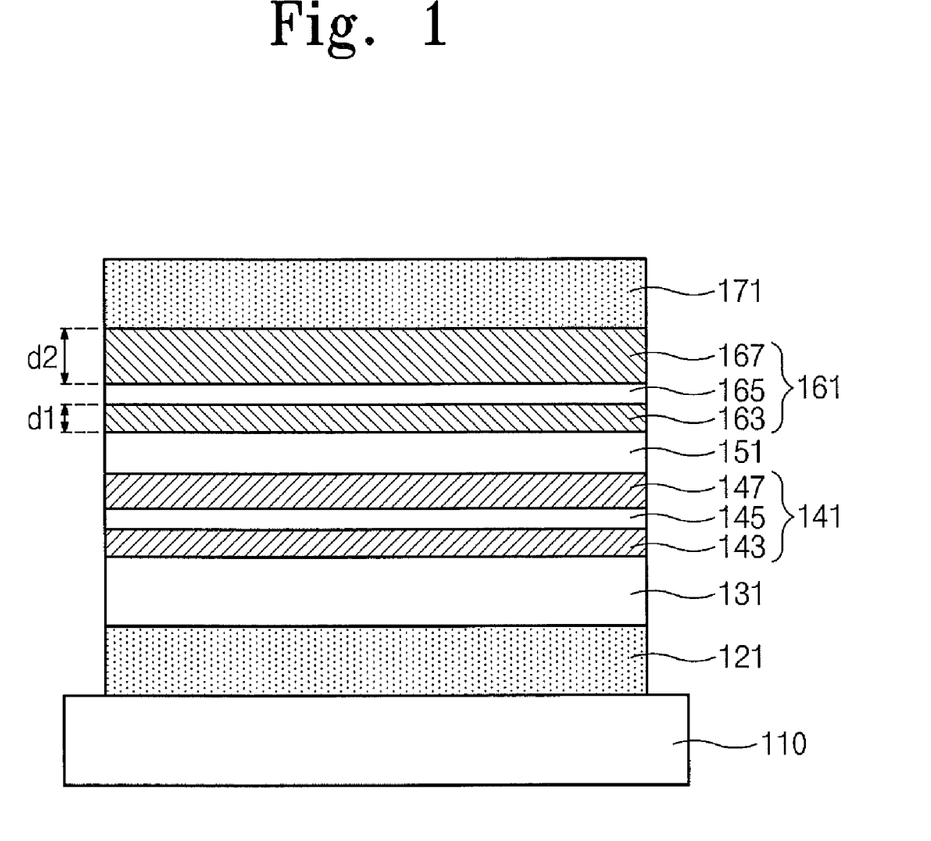
FIG. 1 is a cross sectional view illustrating magnetic memory devices in accordance with some embodiments of the inventive concept.

Referring to FIG. 1, a magnetic memory device in accordance with some embodiments of the inventive concept will be described. A lower electrode 121 and an upper electrode 171 are disposed on a substrate 110. A reference layer 141, a tunnel barrier 151, and a free layer 161 may be sequentially stacked between the lower electrode 121 and the upper electrode 171. The reference layer 141, the tunnel barrier 151, and the free layer 161 may provide a magnetic tunnel junction (MTJ). A pinning layer 131 may be provided between the reference layer 141 and the lower electrode 121. A capping layer (not shown) may be further provided between the free layer 161 and the upper electrode 171, and the capping layer may act as a protective layer. Magnetic memory device structures, materials, and methods of fabrication and use are discussed by way of example in U.S. Pat. No. 7,092,283, U.S.

Pat. No. 7,589,994, U.S. Pat. No. 7,523,543, U.S. Pat. No. 7,164,598, U.S. Pat. No. 7,372,722, U.S. Pat. No. 7,369,428, U.S. Publication No. 2006/0027846, U.S. Publication No. 2007/0206411, and U.S. Publication No. 2008/0180980, the disclosures of which are hereby incorporated herein in their entirety by reference.

The pinning layer 131 may include an anti-ferromagnetic material. For example, the pinning layer 131 may include at least one selected from the group consisting of PtMn, IrMn, FeMn, NiMn, MnO, MnS, MnTe, $MnF_2$, $FeF_2$, $FeCl_2$, FeO, $CoCl_2$, CoO, $NiCl_2$, $NiCl_2$. The pinning layer 131, for example, may include a layer of one or more of the above referenced anti-ferromagnetic materials.

The reference layer 141 may include a plurality of magnetic layers. For example, the reference layer 141 may include a first reference magnetic layer 143 adjacent the pinning layer 131, a second reference magnetic layer 147 adjacent the tunnel barrier 151, and a reference nonmagnetic layer 145 between the first reference magnetic layer 143 and the second reference magnetic layer 147.

A magnetization direction of the first reference magnetic layer 143 may be pinned in one direction. The magnetization direction of the first reference magnetic layer 143 may be fixed (or pinned) by the pinning layer 131.

A magnetization direction of the second reference magnetic layer 147 may be pinned in another direction (different than the magnetization direction of the first reference magnetic layer 143). The magnetization direction of the second reference magnetic layer 147 may be pinned in a direction which is anti-parallel with respect to the magnetization direction of the first reference magnetic layer 143. This difference in magnetization directions may be caused by an exchange coupling of the first and second magnetic layers 143 and 147 by the reference nonmagnetic layer 145.

The first reference magnetic layer 143 may reduce a degree that the second reference magnetic layer 147 affects the free layer 161. For example, a magnetization direction of the free layer 161 may be changed, and write and/or read operations of the magnetic memory device may be performed using a change of the magnetization direction of the free layer 161. The magnetization direction of the free layer 161, however, may be fixed to be anti-parallel with respect to a magnetization direction of the second reference magnetic layer 147 by a magnetic field of the second reference magnetic layer 147 so that a normal write and/or read operation may not be performed. A portion of a magnetic field of the second reference magnetic layer 147 may be offset by introducing the first reference magnetic layer 143 having a magnetization direction which is anti-parallel with respect to the second reference magnetic layer 147. Accordingly, pinning a magnetization direction of the free layer 161 by the second reference magnetic layer 147 may be reduced.

Each of the first and second reference magnetic layers 143 and 147 may include a ferromagnetic material(s). For example, the first reference magnetic layer 143 and/or the second reference magnetic layer 147 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, EuO, and/or $Y_3Fe_5O_{12}$. The reference nonmagnetic layer 145 may include at least one selected from the group consisting of ruthenium (Ru), iridium (Ir), chromium (Cr), and/or rhodium (Rh).

The tunnel barrier 151 may be formed of an insulating material. The tunnel barrier 151 may include, for example, a layer of magnesium oxide and/or aluminum oxide. The tunnel barrier 151 may be formed to have a thickness less than a spin diffusion length. The term spin diffusion length means an effective length that an electron moves in a layer without a change of a spin.

The free layer 161 may include a plurality of magnetic layers. For example, the free layer 161 may include a first magnetic layer 163 adjacent the tunnel barrier 151, a second magnetic layer 167 adjacent the upper electrode 171, and a nonmagnetic layer 165 between the first magnetic layer 163 and the second magnetic layer 167. The first and second magnetic layers 163 and 167 may be exchange-coupled with each other through the nonmagnetic layer 165. A thermal stability of the free layer 161 may be improved through an interaction between the first and second magnetic layers 163 and 167. Magnetic layers 163 and/or 167 may be provided using one or more of the ferromagnetic materials discussed above with respect to magnetic layers 143 and 147. Nonmagnetic layer 165 may be provided using one or more of the nonmagnetic materials discussed above with respect to nonmagnetic layer 145.

A magnetic memory device with a free layer including a plurality of magnetic layers in accordance with some embodiments of the inventive concept may have a relatively high driving efficiency. When a magnetic memory device includes a free layer with only a single magnetic layer, a thickness of a layer may have to be increased to increase a thermal stability. When a thickness of a layer increases, however, a critical switching current density required to drive the memory device may also increase so that a driving efficiency may be reduced. Alternatively, when a magnetic memory device includes a free layer with two magnetic layers and a nonmagnetic layer therebetween in accordance with some embodiments of the inventive concept, a thermal stability may be improved without increasing a thickness of the free layer. Accordingly, a magnetic memory device may be provided which can operate with a relatively low critical switching current density.

The first and second magnetic layers 163 and 167 may have different magnetic characteristics. For example, a product of a saturated magnetization ($Ms_1$) of the first magnetic layer 163 and a thickness ($d_1$) of the first magnetic layer 163 may be less than a product of a saturated magnetization ($Ms_2$) of the second magnetic layer 167 and a thickness ($d_2$) of the second magnetic layer 167. For example, a product of a saturated magnetization ($Ms_1$) of the first magnetic layer 163 and a thickness ($d_1$) of the first magnetic layer 163 may be less than half of a product of a saturated magnetization ($Ms_2$) of the second magnetic layer 167 and a thickness ($d_2$) of the second magnetic layer 167, so that:

$$((Ms_1*d_1)/(Ms_2*d_2)<(1/2)) \text{ or } ((Ms_1*d_1)<(Ms_2*d_2)*(1/2)).$$

When a product of a saturated magnetization ($Ms_1$) of the first magnetic layer 163 and a thickness ($d_1$) of the first magnetic layer 163 is greater than half of a product of a saturated magnetization ($Ms_2$) of the second magnetic layer 167 and a thickness ($d_2$) of the second magnetic layer 167, a critical switching current density of the free layer 161 including the first and second magnetic layers 163 and 167 may be insufficiently reduced. More particularly, when a product of a saturated magnetization ($Ms_1$) of the first magnetic layer 163 and a thickness ($d_1$) of the first magnetic layer 163 is greater than half of a product of a saturated magnetization ($Ms_2$) of the second magnetic layer 167 and a thickness ($d_2$) of the second magnetic layer 167, a magnetic field of the second magnetic layer may not sufficiently influence the first magnetic layer 163. That is, a sufficient interaction between the first and second magnetic layers may not occur, so that a thermal stability is not effectively increased. Accordingly, a thickness of the magnetic layer may have to be increased to provide thermal stability for the magnetic memory device. Thus, a critical switching current density may also increase. However, magnetic memory devices in accordance with some embodiments of the inventive concept may provide a thermal stability sufficient to embody a magnetic memory device without significantly increasing a thickness of the magnetic layers because the second magnetic layer 167 may provide a sufficient magnetic field to the first magnetic layer 163. Thus, when a magnetic memory device operates, a critical switching current density may also be reduced.

In some embodiments of the inventive concept, the first magnetic layer 163 may include a material having a saturated magnetization less than the second magnetic layer 167. For example, the first magnetic layer 163 may include a ferromagnetic material together with a relatively light metal. The relatively light metal designates a metal having gravity (e.g., an atomic weight) the same as or less than that of titanium (Ti). For example, the first and second magnetic layers 163 and 167 may include at least one of cobalt (Co), iron (Fe), and nickel (Ni), and the first magnetic layer 163 may further include aluminum (Al). A saturated magnetization of the first magnetic layer 163 may be reduced by doping the first magnetic layer 163 with the relatively light metal (e.g., aluminum). Stated in other words, a concentration of the relatively light metal (e.g., aluminum) in the first magnetic layer 163 may be greater than a concentration of the relatively light metal (e.g., aluminum) in the second magnetic layer 167. Additionally, a thickness ($d_1$) of the first magnetic layer 163 may be less than a thickness ($d_2$) of the second magnetic layer 167 ($d_1 < d_2$).

A stability of magnetization of a magnetic memory device including the first and second magnetic layers 163 and 167 may be improved due to a difference of magnetic characteristics of the first and second magnetic layers 163 and 167 as discussed above. For example, a saturated magnetization of the second magnetic layer 167 ($Ms_2$) may be greater than a saturated magnetization of the first magnetic layer 163 ($Ms_2$) or a thickness ($d_2$) of the second magnetic layer 167 may be greater than a thickness ($d_1$) of the first magnetic layer 163. As a relative difference of thicknesses between the first and second magnetic layers 163 and 167 and/or a relative difference of saturated magnetizations of the first and second magnetic layers 163 and 167 increases, a magnetic field which the second magnetic layer 167 provides to the first magnetic layer 163 may increase. Thus, the first magnetic layer 163 may have a relatively stable magnetization. In a magnetic memory device, an interpretation of stored data may be performed using a resistance change due to relative magnetization directions of the reference layer 141 and the first magnetic layer 163 (e.g., whether the magnetization directions of the reference layer 141 and the first magnetic layer 163 are parallel or anti-parallel). In a magnetic memory device in accordance with embodiments of the inventive concept, the magnetic memory device may more stably store data because the first magnetic layer 163 may maintain a relatively stable magnetization state.

In some embodiments of the inventive concept, a product of saturated magnetization ($Ms_1$) of the first magnetic layer 163 and a thickness ($d_1$) of the first magnetic layer 163 may be greater than one-sixth of a product of a saturated magnetization ($Ms_2$) of the second magnetic layer 167 and a thickness ($d_2$) of the second magnetic layer 167 so that:

$$((Ms_1 * d_1)/(Ms_2 * d_2)) > (1/6)) \text{ or } ((Ms_1 * d_1) > (1/6) * (Ms_2 * d_2)).$$

When a product of a saturated magnetization ($Ms_1$) of the first magnetic layer 163 and a thickness ($d_1$) of the first magnetic layer 163 is less than one-sixth of a product of a saturated magnetization ($Ms_2$) of the second magnetic layer 167 and a thickness ($d_2$) of the second magnetic layer 167, a magnetization inversion of the first magnetic layer 163 may be relatively unstable. This instability may arise because a magnetic field provided by the second magnetic layer 167 to the first magnetic layer 163 is too great.

According to some embodiments of the inventive concept, however, when a product of a saturated magnetization ($Ms_1$) of the first magnetic layer 163 and a thickness ($d_1$) of the first magnetic layer 163 is greater than one-sixth of a product of a saturated magnetization ($Ms_2$) of the second magnetic layer 167 and a thickness ($d_2$) of the second magnetic layer 167, the first magnetic layer 163 may perform a more stable magnetization inversion. Thus, a writing accuracy of a magnetic memory device may be improved.

The upper electrode 171 may be formed to have a planar shape or an electrode contact type shape on the free layer 161. When the upper electrode 171 has an electrode contact shape, another conductive layer may be formed on the upper electrode 171. Alternatively, the upper electrode 171 may have an electrode contact shape and another conductive layer may be formed to have one layer without a boundary.

Figure 3:
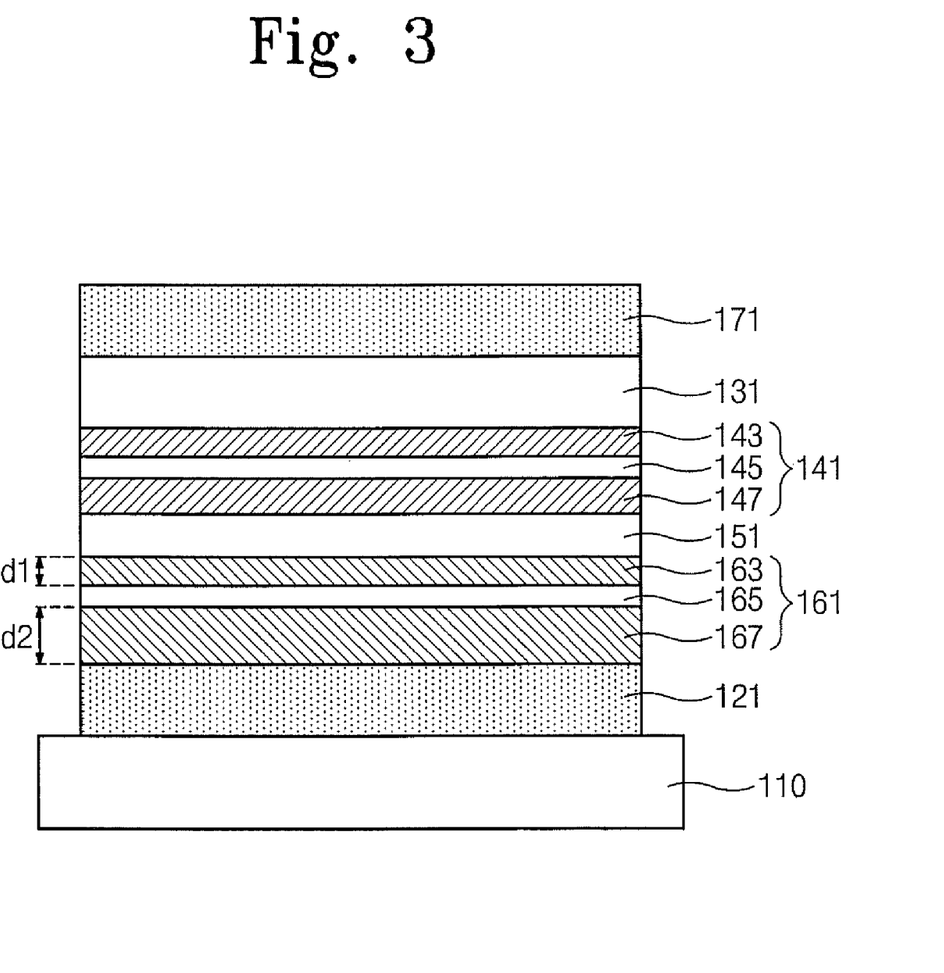
FIG. 3 is a cross sectional view illustrating magnetic memory devices in accordance with some other embodiments of the inventive concept.

Referring to FIG. 3, the reference layer 141, the tunnel barrier 151, and the free layer 161 described above may be stacked in a different order. For example, the free layer 161, the tunnel barrier 151, and the reference layer 141 may be sequentially stacked between the lower electrode 121 and the upper electrode 171. In this case, the pinning layer 131 may be provided between the upper electrode 171 and the reference layer 141. A capping layer (not shown) may be provided between the pinning layer 131 and the upper electrode 171.

Referring back to FIG. 1, writing methods of a magnetic memory device are described as follows. A first writing method of a magnetic memory device is described with respect to the structure of FIG. 1. The reference layer 141 may have a fixed magnetization direction. More particularly, the reference layer 141 may include the first reference layer 143 fixed to a first magnetization direction and the second reference layer 147 fixed to a second magnetization direction anti-parallel with respect to the first magnetization direction. The nonmagnetic layer 145 between the first and second reference layers 143 and 147 may provide separation so that the first and second reference layers 143 and 147 may have magnetization directions which are anti-parallel with respect to each other.

The free layer 161 may include the first magnetic layer 163 and the second magnetic layer 167, and a magnetization direction of each of the reference layers 163 and 167 may be variable. When the first magnetic layer 163 has a magnetization direction of a specific direction, the second magnetic layer 167 may have a magnetization direction which is anti-parallel with respect to the magnetization direction of the first magnetic layer 163. This anti-parallel relationship may be due to an exchange coupling by the nonmagnetic layer 165 between the first and second magnetic layers 163 and 167.

A voltage may be applied so that a current flows from the upper electrode 171 to the lower electrode 121 so that electrons may move from the lower electrode 121 to the upper electrode 171. The electrons may move to cross top surfaces and bottom surfaces of the lower and upper electrodes 121 and 171. The moving electrons may include electrons having a spin of a first direction and electrons having a spin of a second direction. The first and second directions may be anti-parallel with respect to each other. The electrons may pass through the lower electrode 121 and the pinning layer 131, and then may pass through the reference layer 141. Electrons which pass through the reference layer 141 may include a majority of electrons having a spin of the second direction parallel to a magnetization direction of the second reference layer 147 and a minority of electrons having a spin of the first direction anti-parallel to a magnetization direction of the second reference layer 147.

Electrons which pass through the second reference layer 147 may tunnel through the tunnel barrier 151. As described above, the tunnel barrier 151 may be formed to have a thickness less than a spin-diffusion length. Thus, the electrons which passed through the tunnel barrier 151 may pass through the tunnel barrier 151 while maintaining an original spin direction.

The electrons which passed through the tunnel barrier 151 may transfer a spin angular momentum to electrons included in the free layer 161. Accordingly, a magnetization direction of the free layer 161 may be determined by a spin direction of the majority electrons. In the free layer 161, a magnetization direction of the first magnetic layer 163 adjacent to the tunnel barrier 151 may be determined to be the second direction. The second magnetic layer 167 may have a magnetization direction which is anti-parallel with respect to the first magnetic layer 163 by the nonmagnetic layer 165.

Magnetization directions of the second reference layer 147 adjacent to the tunnel barrier 151 and the first magnetic layer 163 may be parallel with respect to each other due to the results discussed above. When magnetization directions of the second reference layer 147 and the first magnetic layer 163 are parallel with respect to each other, a magnetic resistance of a magnetic tunnel junction including the second reference layer 147 and the first magnetic layer 163 may be lower than when the magnetization directions are anti-parallel with respect to each other.

A second writing method of a magnetic memory device in accordance with embodiments of the inventive concept will be described. A current in a direction opposite with respect to the current direction in the first writing method flows between the upper electrode 171 and the lower electrode 121. That is, electrons move from the upper electrode 171 to the lower electrode 121. The electrons may include electrons having a spin of a first direction and electrons having a spin of a second direction in a manner similar to the first writing method. The descriptions of magnetization directions of the reference layer 141 and the free layer 161 described in the first writing method are applied to the second writing method.

The electrons move from the upper electrode 171 to pass through the free layer 161. Electrons which passed through the free layer 161 tunnel through the tunnel barrier 151 to reach the reference layer 141. Among the electrons reaching the reference layer 141, electrons having a spin of a direction the same as a magnetization direction of the second reference layer 147 adjacent to the tunnel barrier 151 (that is, the second direction) may pass through the second reference layer 141. A greater portion of the electrons having a spin of the first direction may not pass through the second reference layer 141. Thus, the electrons having a spin of the first direction may accumulate at the first magnetic layer 163.

A magnetization direction of the first magnetic layer 163 may be changed to the first direction due to the accumulation of electrons having a spin of the first direction. Thus, the first magnetic layer 163 and the second reference layer 147 may have magnetization directions which are anti-parallel with respect to each other. A resistance of a magnetic tunnel junction including the first magnetic layer 163 and the second reference layer 147 may be higher than the magnetic tunnel junction in the first writing method described above. Data stored in a magnetic memory device may be read using the resulting difference of the resistance.

Figure 2A:
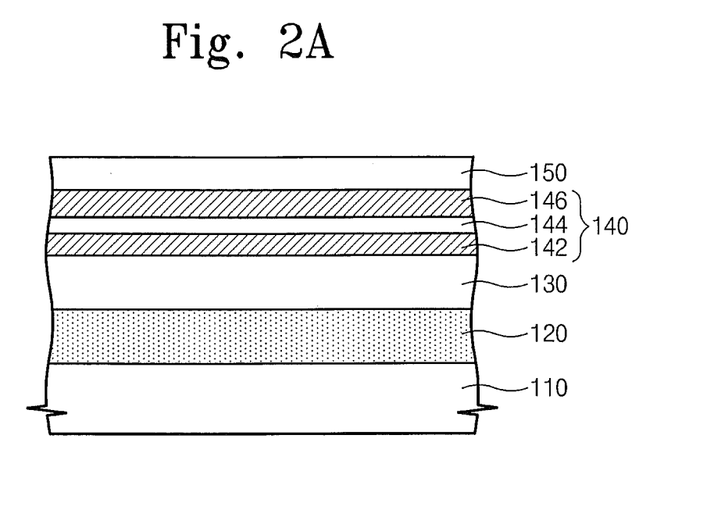
FIGS. 2A and 2B are cross sectional views illustrating operations of forming magnetic memory devices in accordance with some embodiments of the inventive concept.

A method of forming a magnetic memory device in accordance with some embodiments of the inventive concept will be described with reference to FIGS. 2A and 2B.

A lower electrode layer 120 may be formed on a substrate 110. The lower electrode layer 120 may be electrically connected to other electrical elements in the substrate 110. For example, the lower electrode layer 120 may be electrically connected to a transistor and/or a diode in the substrate 110.

A preliminary pinning layer 130 may be formed on the lower electrode layer 120. The preliminary pinning layer 130 may include an anti-ferromagnetic material. For example, the preliminary pinning layer 130 may include at least one of PtMn, IrMn, FeMn, NiMn, MnO, MnS, MnTe, Mnfd, $FeF_2$, $FeCl_2$, $CoCl_2$, CoO, $NiCl_2$, NiO, and/or Cr.

A preliminary reference layer 140 may be formed on the preliminary pinning layer 130. The preliminary reference layer 140 may include a preliminary first reference magnetic layer 142, a preliminary reference nonmagnetic layer 144, and a preliminary second reference magnetic layer 146 that are sequentially stacked on the preliminary pinning layer 130. The preliminary first reference magnetic layer 142 and the preliminary second reference magnetic layer 146 may each include a ferromagnetic material.

A preliminary tunnel barrier 150 may be formed on the preliminary reference layer 140. The preliminary tunnel barrier 150 may be formed by various deposition methods including atomic layer deposition (ALD) and/or chemical vapor deposition (CVD). The preliminary tunnel barrier 150 may include magnesium oxide and/or aluminum oxide.

Figure 2B:
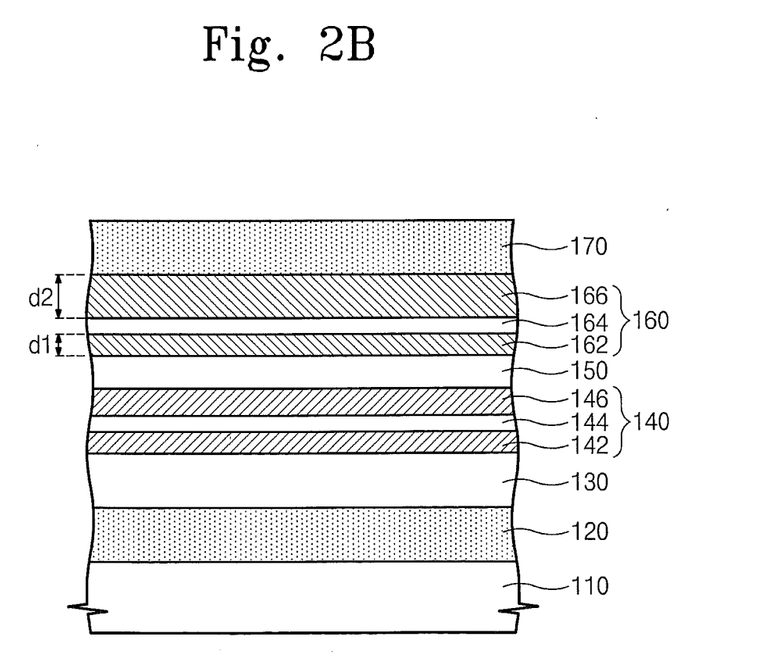

Referring to FIG. 2B, a preliminary free layer 160 may be formed on the preliminary tunnel barrier 150. The preliminary free layer 160 may include a preliminary first magnetic layer 162, a preliminary nonmagnetic layer 164, and a preliminary second magnetic layer 166 that are sequentially stacked on the preliminary tunnel barrier 150.

The preliminary first magnetic layer 162 may include a material having a saturated magnetization ($Ms_1$) less than a saturated magnetization ($Ms_2$) of the preliminary second magnetic layer 166. For example, the preliminary first magnetic layer 162 and the preliminary second magnetic layer 166 may include a same ferromagnetic material, and the preliminary first magnetic layer 162 may further include a relatively light metal. As used herein a light metal designates a metal having gravity smaller than that of titanium (Ti) (e.g., an atomic weight no greater than an atomic weight of titanium). In addition, a thickness ($d_1$) of the preliminary first magnetic layer 162 may be less than a thickness ($d_2$) of the preliminary second magnetic layer 166.

In some embodiments of the inventive concept, a product of a saturated magnetization ($Ms_1$) of the preliminary first magnetic layer 162 and a thickness ($d_1$) of the preliminary first magnetic layer 162 may be greater than one-sixth and less than half of a product of a saturated magnetization ($Ms_2$) of the preliminary second magnetic layer 166 and a thickness ($d_2$) of the preliminary second magnetic layer 166. Stated mathematically:

$$(1/6)*(Ms_2)*(d_2) < (Ms_1)*(d_1) < (1/2)*(Ms_2)*(d_2).$$

A capping layer (not shown) may be formed on the preliminary free layer 160. An upper electrode layer 170 may be formed on the capping layer. The upper electrode layer 170 may be formed to have a flat shape or an electrode contact shape as illustrated in FIG. 2B. When the upper electrode layer 170 is formed to have an electrode contact shape, an interlayer insulating layer surrounding a sidewall of the upper electrode layer 170 may further be formed.

Referring back to FIG. 1, the upper electrode layer 170, the preliminary free layer 160, the preliminary tunnel barrier 150, the preliminary reference layer 140, the preliminary pinning layer 130, and the lower electrode layer 120 may be patterned. As a result, a lower electrode 121, a pinning layer 131, a reference layer 141, a tunnel barrier 151, a free layer 161, and an upper electrode 171 may be formed. The patterning may be performed using one etching process or a plurality of etching processes. For example, after etching a portion of the layers disposed on an upper portion, the other layers may be etched using another etching process.

According to some embodiments of the inventive concept, a magnetic memory device can operate with a relatively low critical switching current. Thus, a magnetic memory device may be provided with improved driving efficiency. Also, a magnetic memory device in accordance with some embodiments of the inventive concept may provide increased thermal stability. Accordingly, a magnetic memory device with improved data storage ability may be provided.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A magnetic memory device comprising:
a tunnel barrier;
a reference layer on a first side of the tunnel barrier; and
a free layer on a second side of the tunnel barrier so that the tunnel barrier is between the reference and free layers,
wherein the free layer comprises a first magnetic layer adjacent the tunnel barrier, a nonmagnetic layer on the first magnetic layer, and a second magnetic layer on the nonmagnetic layer so that the nonmagnetic layer is between the first and second magnetic layers and so that the first magnetic layer is between the tunnel barrier and the second magnetic layer, and
wherein a product of a saturated magnetization of the first magnetic layer and a thickness of the first magnetic layer is less than a product of a saturated magnetization of the second magnetic layer and a thickness of the second magnetic layer.

2. The magnetic memory device of claim 1, wherein the product of the saturated magnetization of the first magnetic layer and the thickness of the first magnetic layer is less than half the product of the saturated magnetization of the second magnetic layer and the thickness of the second magnetic layer.

3. The magnetic memory device of claim 1, wherein the product of the saturated magnetization of the first magnetic layer and the thickness of the first magnetic layer is greater than one-sixth the product of the saturated magnetization of the second magnetic layer and the thickness of the second magnetic layer.

4. The magnetic memory device of claim 1, wherein the saturated magnetization of the first magnetic layer is less than the saturated magnetization of the second magnetic layer.

5. The magnetic memory device of claim 4, wherein the first magnetic layer comprises a ferromagnetic material doped with a light metal.

6. The magnetic memory device of claim 4, wherein the thickness of the first magnetic layer is less than the thickness of the second magnetic layer.

7. The magnetic memory device of claim 1, wherein the reference layer comprises a first reference magnetic layer, a second reference magnetic layer adjacent the tunnel barrier, and a reference nonmagnetic layer interposed between the first and second reference magnetic layers.

8. The magnetic memory device of claim 7, further comprising:
a pinning layer adjacent the first reference magnetic layer, so that the first reference magnetic layer is between the reference nonmagnetic layer and the pinning layer.

9. The magnetic memory device of claim 1, further comprising:
a first electrode adjacent the reference layer; and
a second electrode adjacent to the free layer, wherein the reference, free, and tunnel barrier layers are between the first and second electrodes.

10. The magnetic memory device of claim 9, further comprising:
a substrate wherein the substrate is on the first electrode so that the first electrode is between the substrate and the reference layer or wherein the substrate is on the second electrode so that the second electrode is between the substrate and the free layer.

11. The magnetic memory device of claim 9, wherein a writing operation is performed by applying a current between the first and second electrodes in a direction perpendicular to the first and second electrodes.

12. A method of storing data using a magnetic memory device structure, the method comprising:
providing a magnetic tunnel junction (MTJ) structure including a tunnel barrier, a reference layer on a first side of the tunnel barrier, and a free layer on a second side of the tunnel barrier so that the tunnel barrier is between the reference and free layers, wherein the free layer comprises a first magnetic layer adjacent the tunnel barrier, a nonmagnetic layer on the first magnetic layer, and a second magnetic layer on the nonmagnetic layer so that the nonmagnetic layer is between the first and second magnetic layers and so that the first magnetic layer is between the tunnel barrier and the second magnetic layer, and wherein a product of a saturated magnetization of the first magnetic layer and a thickness of the first magnetic layer is less than a product of a saturated magnetization of the second magnetic layer and a thickness of the second magnetic layer; and
applying an electrical current through the reference layer, the tunnel barrier, and the free layer to perform a write operation for the MTJ structure.

13. The method of claim 12 wherein applying the electrical current comprises applying a first electrical current in a first direction from the reference layer to the free layer to program the MTJ structure to a first data value, and applying a second electrical current in a second direction from the free layer to the reference layer to program the MTJ structure to a second data value different from the first data value.

14. The method of claim 12, wherein the product of the saturated magnetization of the first magnetic layer and the thickness of the first magnetic layer is less than half the product of the saturated magnetization of the second magnetic layer and the thickness of the second magnetic layer.

15. The method of claim 12, wherein the product of the saturated magnetization of the first magnetic layer and the thickness of the first magnetic layer is greater than one-sixth the product of the saturated magnetization of the second magnetic layer and the thickness of the second magnetic layer.

16. The method of claim 12, wherein the saturated magnetization of the first magnetic layer is less than the saturated magnetization of the second magnetic layer.

17. The method of claim 16, wherein the first magnetic layer comprises a ferromagnetic material doped with a light metal.

18. The method of claim 16, wherein the thickness of the first magnetic layer is less than the thickness of the second magnetic layer.

19. The method of claim 12, wherein the reference layer comprises a first reference magnetic layer, a second reference magnetic layer adjacent the tunnel barrier, and a reference nonmagnetic layer interposed between the first and second reference magnetic layers.

20. The method of claim 19, wherein the MTJ structure further includes a pinning layer adjacent the first reference magnetic layer, so that the first reference magnetic layer is between the reference nonmagnetic layer and the pinning layer.

* * * * *